US010333431B2

(12) United States Patent
Clarke

(10) Patent No.: US 10,333,431 B2
(45) Date of Patent: Jun. 25, 2019

(54) NANOPOSITIONER

(71) Applicant: ELEKTRON TECHNOLOGY UK LIMITED, Cambridge, Cambridgeshire (GB)

(72) Inventor: John Andrew Grant Clarke, Cambridgeshire (GB)

(73) Assignee: PRIOR SCIENTIFIC INSTRUMENTS LIMITED (GB)

( * ) Notice: Subject to any disclaimer, the term of this patent is extended or adjusted under 35 U.S.C. 154(b) by 466 days.

(21) Appl. No.: 15/148,295

(22) Filed: May 6, 2016

(65) Prior Publication Data

US 2017/0012557 A1    Jan. 12, 2017

(51) Int. Cl.
*H01L 41/053* (2006.01)
*H01L 41/09* (2006.01)
*H02N 2/02* (2006.01)
*H02N 2/04* (2006.01)

(52) U.S. Cl.
CPC ............. *H02N 2/02* (2013.01); *H01L 41/053* (2013.01); *H01L 41/0536* (2013.01); *H01L 41/09* (2013.01); *H02N 2/04* (2013.01)

(58) Field of Classification Search
CPC .......... H02N 2/02; H02N 2/04; H01L 41/053; H01L 41/0536; H01L 41/09
USPC ............................................. 310/323.17, 328
See application file for complete search history.

(56) References Cited

U.S. PATENT DOCUMENTS 6,501,210 B1   12/2002   Ueno
2005/0231075 A1  10/2005   Xu
2008/0078240 A1   4/2008   Hansma

FOREIGN PATENT DOCUMENTS

| CN | 101969276 A | 2/2011 |
| EP | 0 499 149 A1 | 8/1992 |
| JP | H11-271479 A | 10/1999 |
| JP | 2009-85746 A | 4/2009 |

OTHER PUBLICATIONS

International Search Report for Application No. PCT/GB2016/051299 dated Aug. 3, 2016.
Park C-H et al: "Tin hard coating prepared by sputter ion plating system with facing target sputtering source RF discharge", Thin Solid Films, Elsevier-Sequoia S.A. Lausanne, CH, vol. 312, No. 1-2, Jan. 14, 1998.
Search Report for Application No. GB1507837.1 dated Oct. 30, 2016.

*Primary Examiner* — Thomas M Dougherty
(74) *Attorney, Agent, or Firm* — Tarolli, Sundheim, Covell & Tummino LLP

(57) ABSTRACT

We describe a nanopositioning device comprising: a mount and a moving stage held within said mount, preferably by sets of flexures on opposite sides of the stage such that the stage is displaceable in a longitudinal direction within said mount. A piezoelectric actuator is mechanically coupled to said stage to controllably displace the stage in a longitudinal direction. In embodiments the flexures comprise metal leaves having a plane extending between the stage and the mount perpendicular to said longitudinal direction. The device includes various additional features to improve resolution, frequency response and the like.

20 Claims, 6 Drawing Sheets

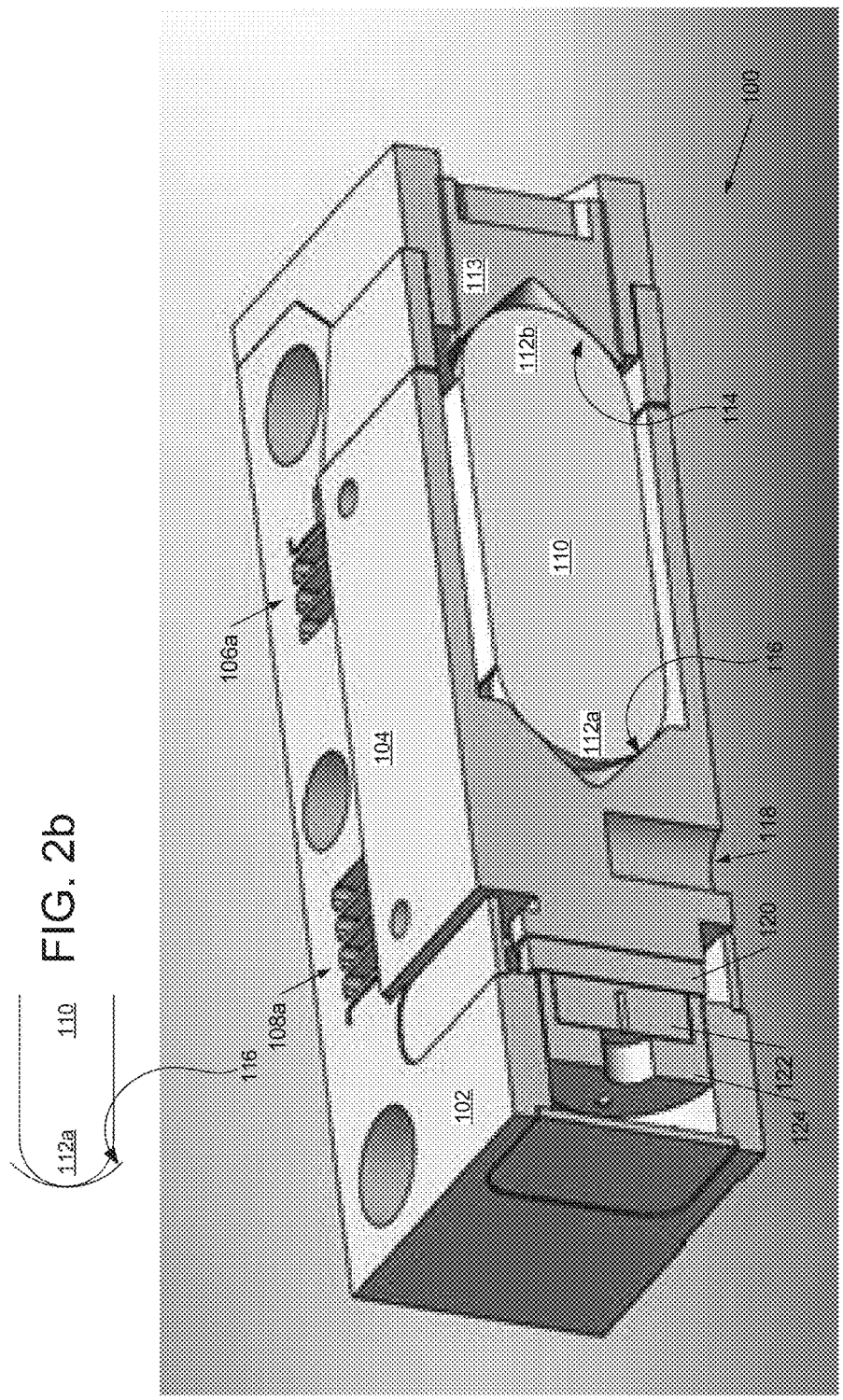

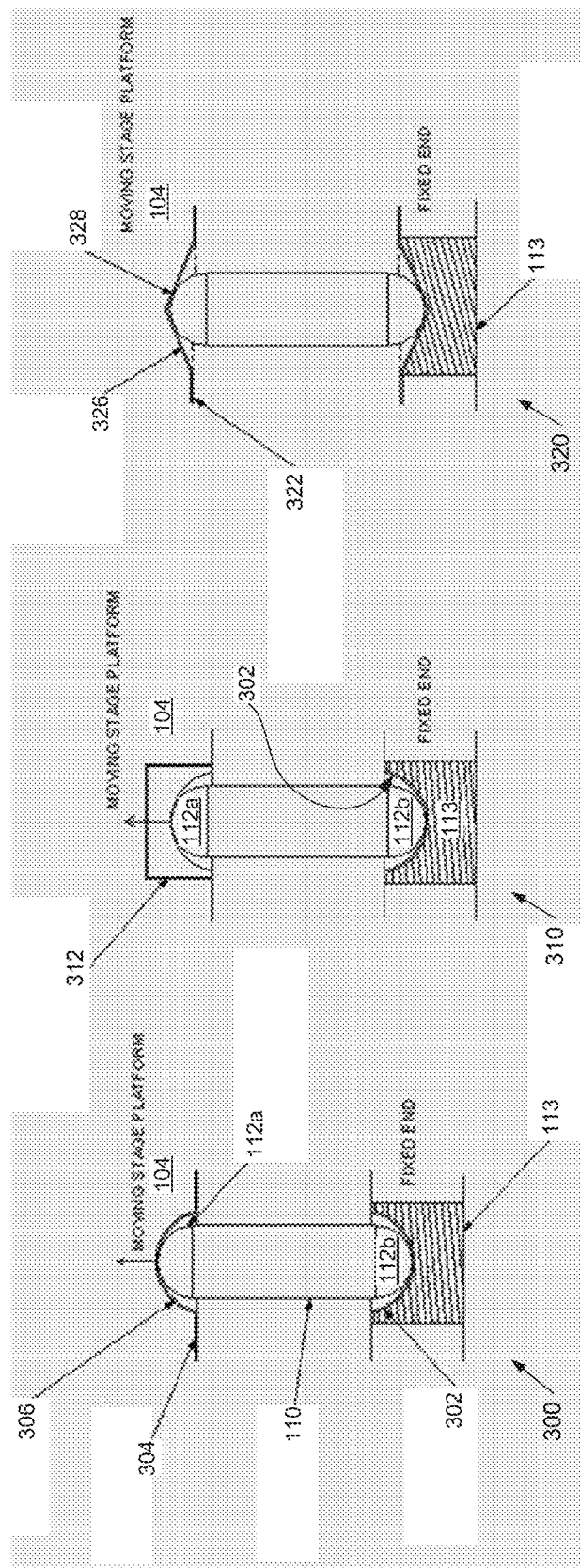

NANOPOSITIONER

FIELD OF THE INVENTION

This invention relates to a nanopositioning device, that is to a device which is able to controllably position a stage with a sub-micrometer accuracy.

BACKGROUND TO THE INVENTION

The applicant, a world leader in nanopositioner design, has been selling piezoelectric nanopositioning systems under the brand Queensgate Instruments.

The applicant's current generation of devices can position to sub-nanometer resolution, but there is a continuing desire to improve the designs. The parameters which are relevant to an improved design include resonant frequency (the frequency at which the stage becomes unstable), bandwidth (the frequency at which the stage can still be driven and maintain accuracy), resolution (in part determined by sensor resolution), speed of motion, travel range, settle time, linearity, rotational error, thermal drift, and maximum stage load. Optimising some of these parameters involves trade-offs but there is a general need for performance improvement.

SUMMARY OF THE INVENTION

According to a first aspect of the invention there is therefore provided a nanopositioning device comprising: a mount; a moving stage, held within said mount by sets of flexures on opposite sides of the stage such that the stage is displaceable in a longitudinal, for example horizontal, direction within said mount; and a piezoelectric actuator mechanically coupled to said stage to controllably displace the stage in said longitudinal direction; wherein said flexures comprise metal leaves having a plane extending between said stage and said mount perpendicular to said longitudinal direction; and wherein said metal leaves have a hardened surface layer.

The use of flexures comprising multiple metal leaves helps to increase the resonant frequency. The flexures can also provide a preload against which the piezoelectric actuator pushes. Such a load facilitates system in the stage being pushed fast and then stopping without the brittle piezoelectric actuator going into tension. The resonant frequency of the stage is in part dependent upon the ratio of the stiffness of the flexures to the mass of the stage, more particularly on the square root of this ratio. In embodiments, by providing the metal leaves with a hardened surface layer on one or preferably both of the surfaces of a leaf the stiffness of the flexures can be increased while also providing an increased travel range before yield occurs. This is achieved particularly by virtue of the increased surface strength and the compressive residual stresses in this layer. Furthermore a high stiffness reduces mechanical noise in the device—for example embodiments of the devices we described can be positioned to an accuracy of 30 pm over a 18 µm travel. Similarly the resonant frequency can be approximately doubled.

In some preferred embodiments the metal leaves comprise titanium or steel; preferably the hardened surface layer comprises a nitride layer such as titanium nitride.

In embodiments the thickness of a leaf may be in the range 200-1000 µm whilst the thickness of the hardened surface layer may be in the range 1-10 µm (although the nitriding can have some influence on regions of the metal beneath the surface layer).

In the above and following description, the stage may alternatively be referred to as a platform or stage platform.

In a related aspect the invention provides a nanopositioning device, in particular as described above, and further comprising an adjustable preload device mechanically coupled between the piezoelectric actuator and the mount such that the device is adjustable to preload the piezoelectric actuator, in particular to define a flexure offset.

In some preferred embodiments the preload device comprises a screw with a concave face against which the piezoelectric actuator bears. Preloading is advantageous and this arrangement is beneficial because it provides more space by removing the need for a preloading spring, as well as simplifying the construction.

In another aspect the invention provides a nanopositioning device comprising: a mount; a moving stage held within said mount, preferably by sets of flexures on opposite sides of the stage, such that the stage is displaceable in a longitudinal direction within said mount; and a piezoelectric actuator mechanically coupled to said stage to controllably displace the stage in said longitudinal direction, in particular wherein said piezoelectric actuator is located between a region of the mount and a region of the stage (platform); the device including a (longitudinal) position sensor towards one longitudinal end of said stage; wherein said position sensor comprises a capacitive position sensor to sense position by sensing capacitance between a first moveable plate of a capacitor and a second stationary plate of the capacitor; wherein said stationary plate of said capacitor comprises a stationary portion of said mount; and wherein said moveable plate of said capacitor comprises a plate member mounted such that it is attached to said stage and held displaced away from said stage.

In will be appreciated that the accuracy/resolution of the position sensor sensing the longitudinal position of the stage has an effect on the absolute accuracy and positioning resolution with which a stage may be driven. In one approach the position of the stage may be sensed by capacitive sensing, where one plate is mounted to the stage platform. However at the very small distance scales contemplated the metal stage platform face where the sensor is mounted may be imagined to behave more like a block of flexible rubber than solid metal. Thus when the stage is pushed by the actuator the shape of a surface of the stage can change (it can dish, creating hysteresis), and this can result in inaccuracy.

By mounting a plate of the capacitive position sensor so that it is mechanically attached to but positioned (displaced) away from the strained region the effects of distortion of the stage can be reduced, thereby improving bidirectional linearity. It is preferable, although not essential, that the plate is mounted to a mid-point of one end of the stage as this provides a convenient point of reference, but this is not essential. The plate member may be attached at a point to the stage, for example mounted to the stage by bonding with an insulating layer to a T shaped support. In preferred embodiments a guard ring is also provided for the sensing plates of the capacitor.

In another aspect the invention provides a nanopositioning device comprising: a mount; a moving stage held within said mount such that the stage is displaceable in a longitudinal direction within said mount; and a piezoelectric actuator, typically in the form of a rod, extending between said stage and said mount to controllably displace the stage in said longitudinal direction; wherein said piezoelectric actuator (rod) bears upon a first action region of said stage and upon a second action region of said mount such that the actuator is able to move said action regions part to displace said stage; and wherein one or both of said first and second action regions is concave or dished.

One technique for mechanically coupling the piezoelectric actuator to the stage is using a form of simplified ball joint where the male half is spherical and the female conical. However this can transmit lateral as well as longitudinal forces and it is desirable to reduce the amount of lateral force mechanical coupling that the piezoelectric actuator can apply to the stage. This is because under load the piezoelectric actuator can deform in a transverse direction (it can snake or adopt a "banana" shape).

An improved coupling applies force via a concave or dished feature in which the piezoelectric actuator (rod) locates. Here concave/dished is used in a general sense to mean hollowed inward. In some embodiments a mechanical interface between the piezoelectric actuator rod and a concave or dished action region defines a ring. However in preferred embodiments this interface defines a substantially Hertzian or point-like contact (although some plastic deformation may occur).

In general a narrow ring or point contact reduces the lateral force or torque which the actuator may apply, but this can reduce the overall stiffness of the stage. Preferably, therefore, for this reason, and to reduce permanent or plastic deformation (and hence loss in displacement range), and to allow a smaller contact area to be employed, an action region on which the actuator bears has a hardened surface layer, for example similar to that described above. Thus such an action region may comprise titanium or steel with a hardened, for example nitride, surface layer or a ceramic coating; alternatively a ceramic insert or cup may be employed. The end of the piezoelectric actuator which bears upon such an action region is preferably (also) of ceramic, for example alumina.

In some preferred embodiments the piezoelectric actuator is provided with ceramic ball ends and mounted between concave or dished regions (of larger radius). These dished regions may be provided by the above described adjusting screw and the stage (moving platform). Preferably these dished regions are hardened to allow a smaller contact area to be achieved for the same stiffness.

In a further aspect the invention provides a nanopositioning device comprising: a mount; a moving stage, held within said mount such that the stage is displaceable in a longitudinal direction within said mount; and a piezoelectric actuator mechanically coupled to said stage to controllably displace the stage in said longitudinal direction; wherein said piezoelectric actuator is located towards a first longitudinal end of said stage, the device including a longitudinal position sensor towards a second, opposite longitudinal end of said stage; and wherein said stage includes a cavity located longitudinally between said actuator and said position sensor to increase a compliance of said stage in a region between an end of said piezoelectric actuator and said longitudinal position sensor.

Such an approach helps to locally reduce distortion. In embodiments the cavity is located in a base region of the stage; preferably it comprises a hole opening out to a surface of the stage.

In broad terms when the actuator pushes the stage there can be a top-to-bottom shear of the stage. Providing a hole or cavity in the base region of the stage adds compliance in this region. The operation of such a cavity is counter-intuitive as it might be imagined that introducing a cavity would result in increased shear between different regions of the stage when acted upon by the piezoelectric actuator. Consider, therefore, the forces provided by the piezoelectric actuator can be many tens of kilograms of force, and when applied to the stage/platform this tends to buckle and distort. By providing a cavity as described this distortion is at least partially decoupled from an end of the platform/stage at which the longitudinal position sensor is located. In embodiments the cavity can significantly reduce bending in a horizontal direction perpendicular to a direction of motion of the sensor face, thus decoupling bending of the stage platform from the sensor.

In a still further aspect the invention provides a nanopositioning device comprising: a mount; a moving stage, held within said mount by sets of flexures on opposite sides the stage such that the stage is displaceable in a longitudinal direction within said mount; and a piezoelectric actuator mechanically coupled to said stage to controllably displace the stage in said longitudinal direction; and further comprising a first pair of sets of flexures at either side of said stage each set of flexures of said first pair comprising a first number of leaves; and a second pair of sets of flexures at either side of said stage and longitudinally displaced from said first pair of sets of flexures, each set of flexures of said second pair comprising a second number of leaves greater than said first number of leaves.

As previously mentioned, the use of flexures provides various advantages. Preferably a set of flexures comprises more than one flexure, for stiffness and to reduce roll about the longitudinal axis. Preferably the flexures are relatively deep that is extending a relatively long way down the side of the stage). In embodiments a first pair of sets of flexures is provided to either side of the stage near the actuator end of the stage, and a second pair of sets of flexures is provided towards the other end of the stage that is longitudinally more distant from the actuator. With this arrangement it is preferable that the number of flexures in the second pair of sets of flexures (the flexures more distant from the actuator) is greater than the number of flexures in the first pair of sets of flexures. This has the effect of locating the larger number of flexures towards the end of the stage/platform with greater mass.

Stage Section

In broad terms embodiments of such flexure arrangements tend to reduce twisting motion of the stage, and tend to limit resonance instability to an axis where it can be compensated for. Thus embodiments these arrangements changes the mechanical resonant modes of oscillation of the stage such that it is generally along the axis of motion. Then one or more force sensors and/or one or more position sensors may be incorporated into the positioning device and used to provide feedback for a closed loop drive/control system. Such an approach is helpful for rapidly controlling the stage, allowing greater bandwidth operation and reduced load sensitivity. This can be achieved when the number of leaves in the different pairs of flexures is different, but is most readily achieved when the number of leaves in the flexure sets with the greatest number of leaves is equal to or greater than 2, 3 or 4, providing increased stiffness. The invention also contemplates achieving a similar result by employing different stiffnesses of flexures for the different pairs of flexures instead of or in addition to different numbers of flexures.

It is particularly advantageous to provide a relatively large number of flexures because this increases the overall stiffness and responsiveness of the structure—for example in a preferred embodiment the first pair of sets of flexures has three leaves and the second pair of sets of flexures has four leaves. The benefits of these approaches can be more readily understood when it is appreciated that the forces applied by the piezoelectric actuator may be extremely large, for example in the region of hundreds or thousands of Newtons.

The skilled person will appreciate that the above described aspects and embodiments of the invention may be combined. In some preferred embodiments of the above described devices the stage and mount, including the flexures, may be fabricated, for example wire (spark) eroded, from a solid block of metal—that is the stage, mount and flexures may be one-piece formed. In some preferred embodiments the metal used has a low coefficient of thermal expansion; for example Super Invar may be employed.

The skilled person will appreciate that although various different aspects of nanopositioning devices according to the invention have been described separately, one or more of these different aspects may be combined within a single device. Thus it will be appreciated that the features and aspects of the invention described above may be combined in any permutation.

BRIEF DESCRIPTION OF THE DRAWINGS

These and other aspects of the invention will now be further described, by way of example only, with reference to the accompanying figures in which:

FIGS. 2a and 2b show, respectively, a cut-away view of the device of FIG. 1, and a preferred embodiment of a Hertzian contact between a piezoelectric actuator and a region of a stage/platform upon which it acts;

FIGS. 3a to 3c show example piezoelectric actuator couplings for use in embodiments of the invention;

DETAILED DESCRIPTION OF PREFERRED EMBODIMENTS

Figure 1:
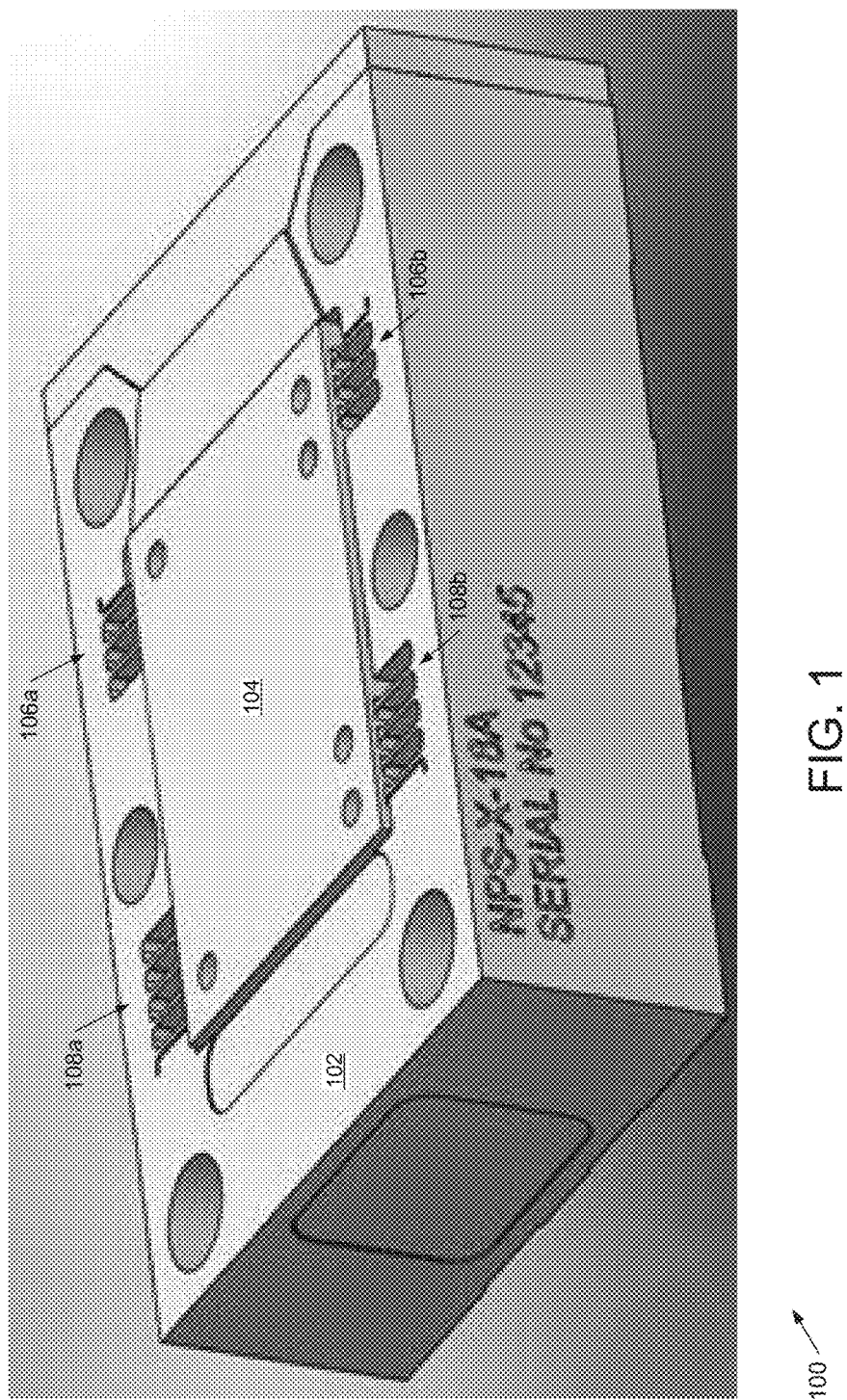
FIG. 1 shows a perspective view of an embodiment of an nanopositioning device according to the invention.

Referring to FIGS. 1 and 2, these show an embodiment of a nanopositioning device 100 comprising a mount 102 supporting a moving stage 104. The moving stage is held within the mount by a first pair of sets of flexures 106a, b and a second pair of sets of flexures 108a, b. The flexures comprise metal leaves of titanium or steel with a 3-5 μm hardened nitride surface, for increased stiffness.

Stage 104 is moved by a piezoelectric actuator 110. Each of flexures 106, 108 has multiple leaves, but flexure 108 has more leaves than flexure 106. In embodiments flexures 108a, b each have four leaves whilst flexures 106a, b have three leaves. Such an arrangement provides increased stability for the stage.

In embodiments the piezoelectric actuator 110 is in the form of a rod comprising a length or stack of piezoelectric material extending between rounded ceramic end caps 112a, b. The actuator applies force between first and second dished "action" regions 114, 116 of the mount 102 and stage 104 respectively. Preferably these have a hardened surface layer such as a nitrided metal or ceramic surface layer, the latter provided by, for example, hemispherical cups or inserts (not shown). Such an arrangement reduces the ability of actuator 110 to apply a side load or torque to the stage 104. FIG. 2a shows an approach employing a ring-shaped contact, and FIG. 2b a preferred alternative employing a substantially Hertzian contact. Preferably force is applied to the mount 102 via an adjustable screw 113, to facilitate pre-loading the stage against the flexures for substantially increased stiffness.

Referring to FIG. 3, this shows details of some example piezoelectric actuator couplings which may be employed in embodiments of the invention. In each case the piezoelectric actuator 110 has rounded (half-sphere) ceramic end caps 112a,b and extends between a fixed end defined by the piezo adjuster screw (preloading screw) 113, and the moving stage platform 104.

In FIG. 3a a first example coupling 300 employs a first hardened layer or ceramic surface 302 at the fixed end, and a second hardened layer or ceramic surface 304, defining a concave cup 306, at the moving end. The ceramic end caps 112a,b make a point-like or Hertzian contact with the layers 302, 304.

In FIG. 3b a second example coupling 310 employs a first hardened layer or ceramic surface 302 at the fixed end, and a ceramic cup insert 312 at the moving end. The ceramic end caps 112a,b again make a point-like or Hertzian contact with the layer 302 and ceramic cup insert 312.

In FIG. 3c a third example coupling 320 employs a hardened layer or ceramic surface 322, 324 to engage with both ends of piezoelectric actuator 110, but the surfaces are conical 326 such that the ceramic end caps 112a,b make ring-like contacts 328 with these surfaces.

Referring again to FIG. 2, in embodiments the stage 104 includes a hole or cavity 118 in the base of the stage. This adds compliance at the base and has the effect of decoupling bending or buckling of the platform from sensed stage position when the actuator 110 applies a force to move stage 104. Optionally but not essentially (and not shown in FIGS. 1 and 2), the base of the stage may be supported by one or more support members extending between the base of the mount and a base region of the stage—that is in embodiments the stage may be attached to the mount at the base.

In embodiments the nanopositioning device includes a stage position sensor, more particularly a capacitive position sensor to sense the longitudinal position of the stage. As illustrated in FIG. 2 this capacitive position sensor may comprise first and second plates 120, 122, the first plate 120 being attached to the stage and the second plate 122 being attached to the mount. Preferably a guard ring 124 is also provided for the sensor. As illustrated in FIG. 2, the plate 120 attached to the moving stage is preferably displaced slightly away from the stage, for example on a very short rod or similar (not shown in FIG. 2), for example in the general shape of a 'T' (with a short vertical stroke). In this way slight deformations of the stage do not deform the (flat) surface of plate 120 of the sensor, thus facilitating more accurate positioning for example by means of an electronic control loop.

Figures 4A, 4B:
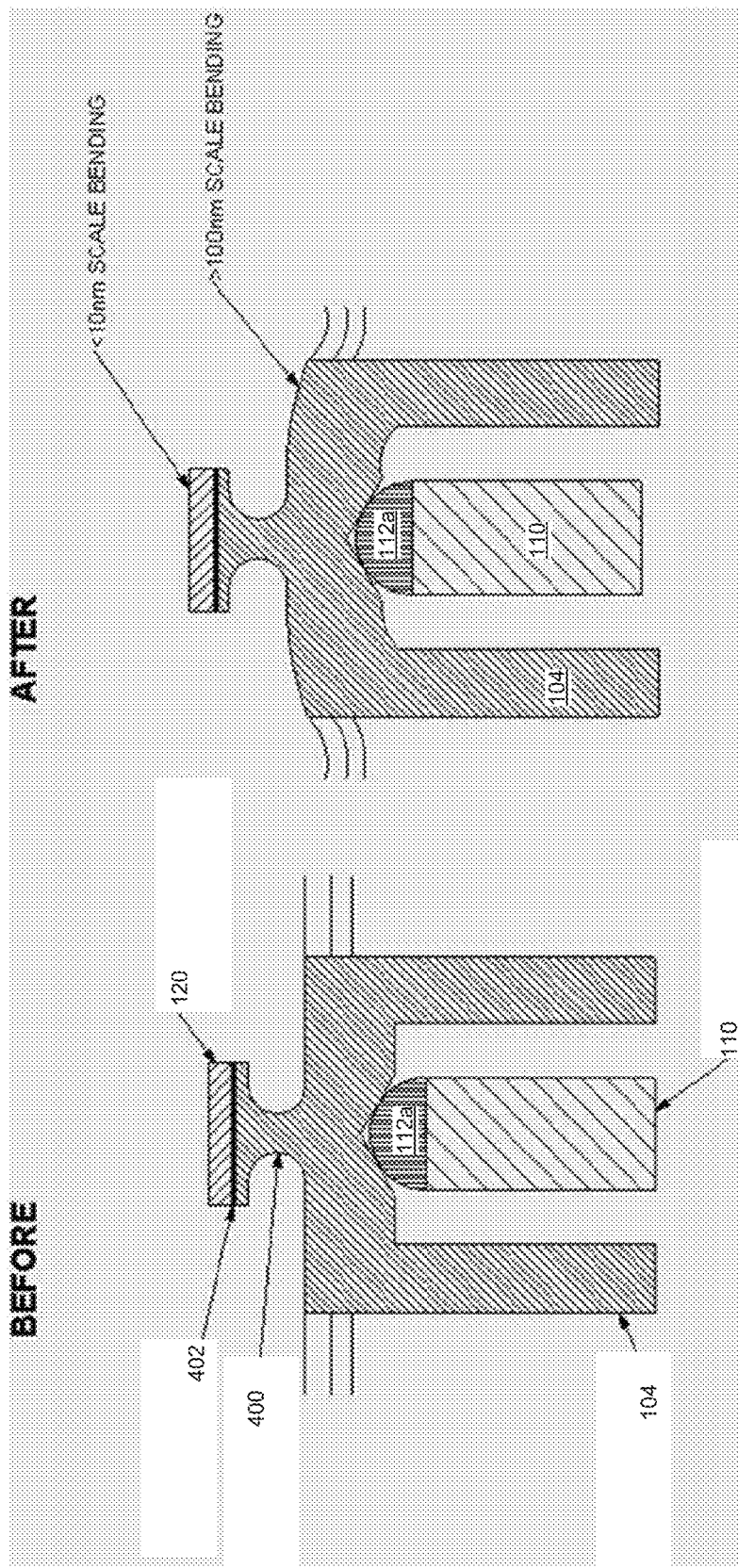
FIGS. 4a and 4b illustrate the operation of an embodiment of a stage/platform position sensor for a nanopositioning device according to an embodiment of the invention device in reducing the effects of distortion within the device.

FIGS. 4a and 4b show cross-sectional views through the actuator, sensor and moving stage platform respectively before and after the platform has been displaced by the actuator. As shown, the capacitive position sensor comprises a capacitive sensor plate 120 mounted on a T-shaped feature 400 with an insulator 402 between the (metal) T-shaped feature 402 and plate 120. As can be seen in FIG. 4b, although the part of the moving stage platform against which the actuator bears may bend and distort by more than 100 nm, the plate 120 of the capacitive position sensor bends/distorts by less than 10 nm.

Figure 5A:
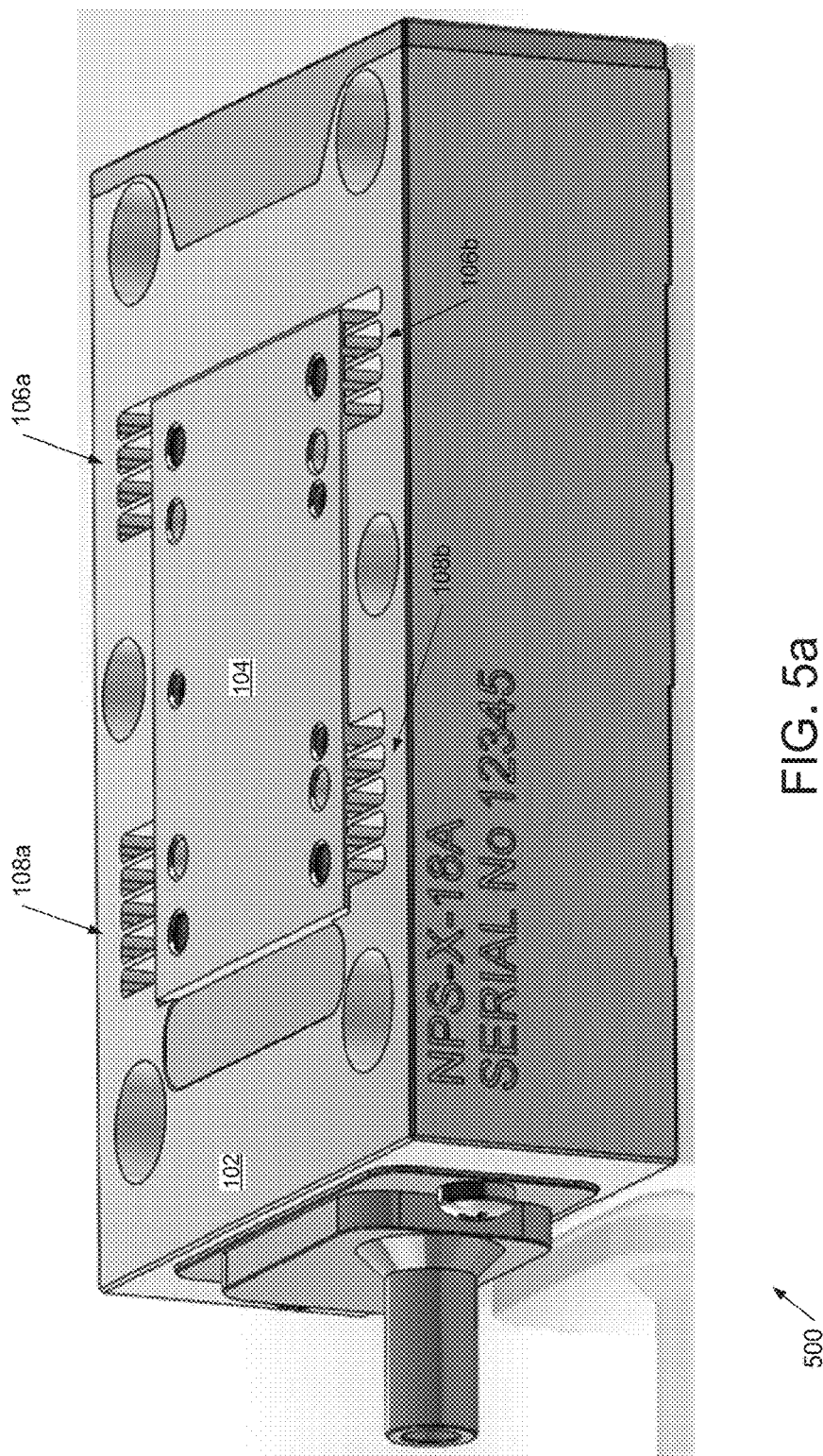
FIGS. 5a and 5b show, respectively, a perspective view and a view of internal components of a variant of the nanopositioning device of FIG. 1.
Figure 5B:
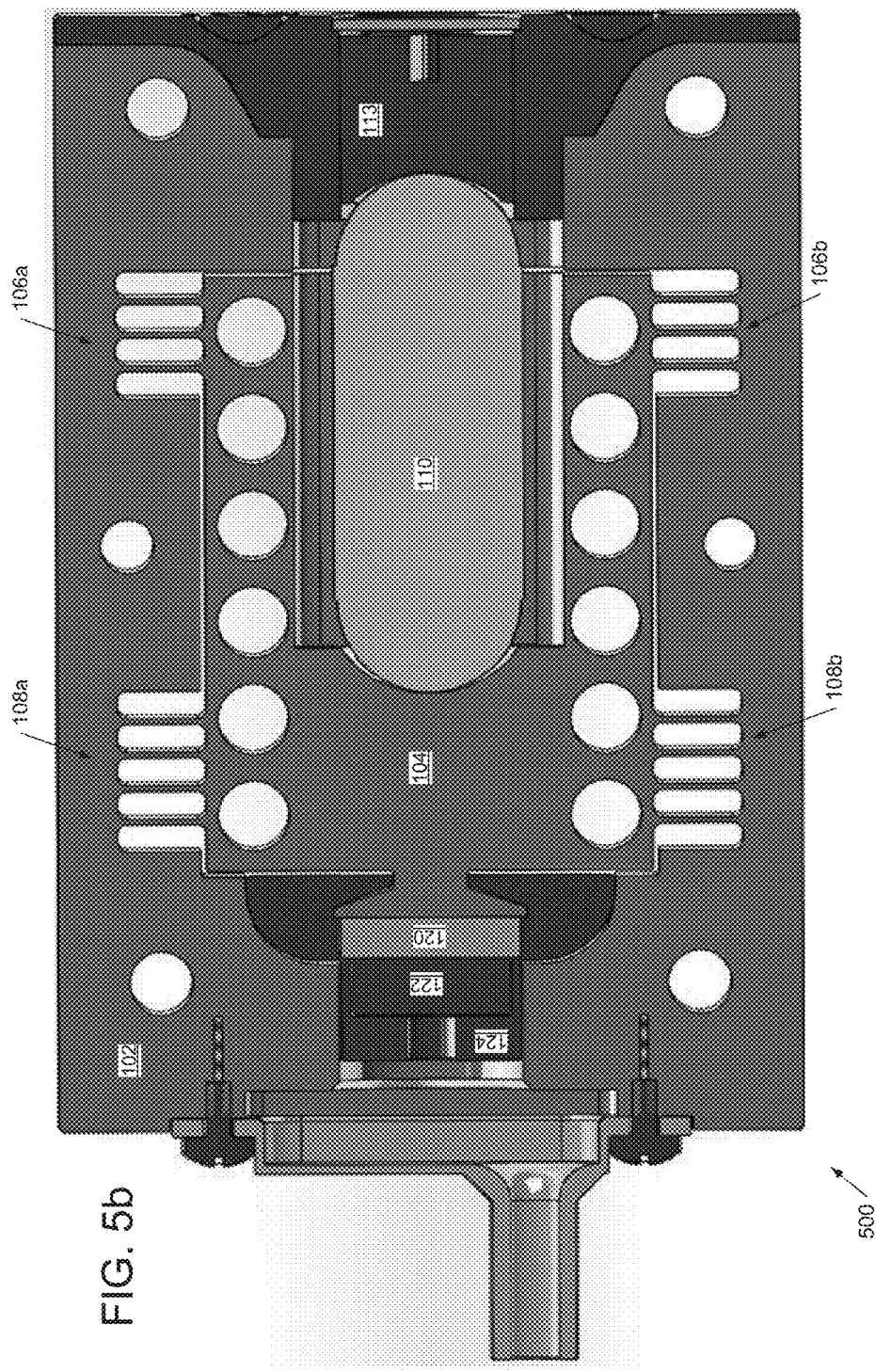

Referring to FIGS. 5*a* and 5*b*, these illustrate a variant 500 of the nanopositioning device of FIGS. 1 and 2 in which like elements to those previously described are illustrated by like reference numerals. These more clearly illustrate the arrangement of flexures in one preferred embodiment.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A nanopositioning device comprising:
 a mount;
 a moving stage, held within said mount by sets of flexures on opposite sides the stage such that the stage is displaceable in a longitudinal direction within said mount;
 a piezoelectric actuator mechanically coupled to said stage to controllably displace the stage in said longitudinal direction;
 a first pair of sets of flexures at either side of said stage each set of flexures of said first pair comprising a first number of metal leaves; and
 a second pair of sets of flexures at either side of said stage and longitudinally displaced from said first pair of sets of flexures, each set of flexures of said second pair comprising a second number of metal leaves greater than said first number of metal leaves.

2. The nanopositioning device of claim 1, wherein said first pair of sets of flexures is closer to said actuator than said second pair of sets of flexures.

3. The nanopositioning device of claim 1, wherein said second pair of sets of flexures is closer to a centre of mass of said moving stage along said longitudinal direction than said first pair of sets of flexures.

4. The nanopositioning device of claim 1, wherein said second pair of sets of flexures comprises at least three metal leaves.

5. The nanopositioning device of claim 1, wherein said metal leaves have a plane extending between said moving stage and said mount perpendicular to said longitudinal direction; and
 wherein said metal leaves have a hardened surface layer.

6. The nanopositioning device of claim 5, wherein said metal leaves comprise titanium or steel, and wherein said hardened surface layer comprises a nitride surface layer.

7. The nanopositioning device of claim 5, further comprising an adjustable preload device mechanically coupled between said piezoelectric actuator and said mount such that said device is adjustable to preload said piezoelectric actuator.

8. The nanopositioning device of claim 7, wherein said adjustable preload device comprises a screw, in particular with a concave face against which said piezoelectric actuator bears.

9. The nanopositioning device of claim 1, further comprising:
 a position sensor towards one longitudinal end of said moving stage,
 wherein said position sensor comprises a capacitive position sensor to sense position by sensing capacitance between a first moveable plate of a capacitor and a second stationary plate of the capacitor;
 wherein said stationary plate of said capacitor comprises a stationary portion of said mount; and
 wherein said moveable plate of said capacitor comprises a plate member mounted such that it is attached to said moving stage and held displaced away from said moving stage.

10. The nanopositioning device of claim 9, wherein said point of attachment of said plate member to said moving stage is a substantially central point at said longitudinal end of said moving stage.

11. The nanopositioning device of claim 10, wherein said plate member is mounted to said moving stage by an insulating support.

12. A nanopositioning device as claimed in claim 1,
 wherein said piezoelectric actuator bears upon a first region of said moving stage and upon a second region of said mount such that the piezoelectric actuator is able to move said regions part to displace said moving stage; and
 wherein one or both of said first and second regions is concave or dished.

13. The nanopositioning device of claim 12, wherein the or each end said piezoelectric actuator which bears upon a said action region is convex.

14. The nanopositioning device of claim 12, wherein a mechanical interface between said piezoelectric actuator and one or both of said concave or dished action regions defines a ring.

15. The nanopositioning device of claim 12, wherein a mechanical interface between said piezoelectric actuator and one or both of said concave or dished action regions comprises a substantially Hertzian contact.

16. The nanopositioning device of claim 12, wherein one or both of said concave or dished action regions has a hardened surface layer.

17. The nanopositioning device of claim 1, wherein said piezoelectric actuator is located towards a first longitudinal end of said moving stage, the nanopositioning device including a longitudinal position sensor towards a second, opposite longitudinal end of said moving stage; and
 wherein said moving stage includes a cavity located longitudinally between said piezoelectric actuator and said position sensor to increase a compliance of said moving stage in a region between an end of said piezoelectric actuator and said longitudinal position sensor.

18. The nanopositioning device of claim 17, wherein said cavity is located in a base region of said moving stage.

19. The nanopositioning device of claim 17, wherein said cavity comprises a hole opening to a surface of said moving stage.

20. The nanopositioning device of claim 17, wherein said cavity extends approximately half way through a thickness of said moving stage in a direction perpendicular to said longitudinal direction.

* * * * *

UNITED STATES PATENT AND TRADEMARK OFFICE
CERTIFICATE OF CORRECTION

PATENT NO. : 10,333,431 B2
APPLICATION NO. : 15/148295
DATED : June 25, 2019
INVENTOR(S) : John Andrew Grant Clarke It is certified that error appears in the above-identified patent and that said Letters Patent is hereby corrected as shown below:

On the Title Page

Item (30) Foreign Application Priority Data is missing.
Please add Priority of GB 1507837.1 filed on May 7, 2015.

Signed and Sealed this
Twenty-ninth Day of October, 2019

Andrei Iancu
*Director of the United States Patent and Trademark Office*